United States Patent
Atami et al.

[11] Patent Number: 5,891,245
[45] Date of Patent: Apr. 6, 1999

[54] SINGLE CRYSTAL PULLING METHOD AND APPARATUS FOR ITS IMPLEMENTATION

[75] Inventors: Takashi Atami; Hiroaki Taguchi; Hisashi Furuya, all of Tokyo; Michio Kida, Omiya, all of Japan

[73] Assignees: Mitsubishi Materials Sillcon Corporation; Mitsubishi Materials Corporation, both of Tokyo, Japan

[21] Appl. No.: 781,842

[22] Filed: Jan. 10, 1997

[30] Foreign Application Priority Data

Jan. 11, 1996 [JP] Japan .................................... 8-003377
Jan. 12, 1996 [JP] Japan .................................... 8-004407

[51] Int. Cl.$^6$ .................................................. C30B 35/00
[52] U.S. Cl. .............................. 117/213; 117/18; 117/30; 117/31; 117/214
[58] Field of Search ................................. 117/18, 30, 31, 117/33, 213, 214

[56] References Cited

U.S. PATENT DOCUMENTS 5,030,315  7/1991  Washizuka et al. ....................... 117/18
5,524,571  6/1996  Kawasaki et al. ....................... 117/213
5,690,733  11/1997  Nagai et al. ............................... 117/18

*Primary Examiner*—Felisa Garrett
*Attorney, Agent, or Firm*—Pillsbury Madison & Sutro LLP

[57] ABSTRACT

A single crystal pulling method employing; a gas tight container, a double crucible for storing a semiconductor melt inside the gas tight container comprising an inter-connected outer crucible and inner crucible, and a source material supply tube suspended from an upper portion of the gas tight container and positioned so that a granulated or powdered source material can be added from a lower end opening thereof to the semiconductor melt inside the outer crucible, with the source material being injected into the source material supply tube together with an inert gas flowing towards the enclosed container, characterized in that said source material is injected under conditions where the flow rate N (1/min·cm$^2$) of the inert gas is within the range 0.0048P+0.0264<N<0.07P, where P (Torr) is the internal pressure inside said gas tight container.

12 Claims, 3 Drawing Sheets

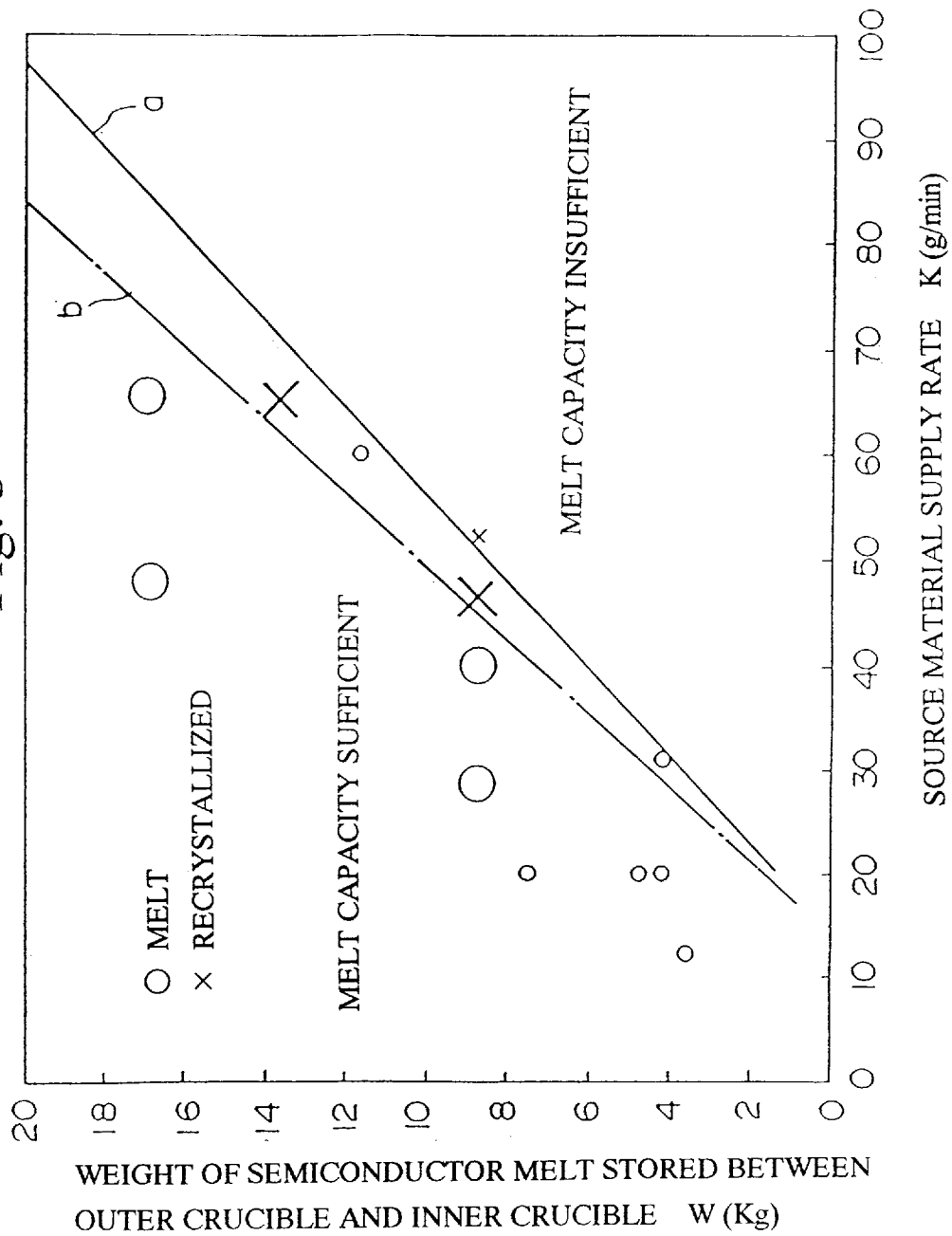

SINGLE CRYSTAL PULLING METHOD AND APPARATUS FOR ITS IMPLEMENTATION

BACKGROUND OF THE INVENTION

1. Field of the Invention

The present invention relates to a single crystal pulling method for producing a single crystal of a semiconductor such as silicon (Si) or gallium arsenide (GaAs) using a continuous charge magnetic field application CZ technique.

2. Description of the Related Art

Single crystal pulling apparatuses employing the CZ technique comprise a gas tight chamber, a crucible for storing a semiconductor melt which is positioned inside the chamber, a heater for heating the semiconductor melt, and a pulling mechanism for pulling a single crystal of the semiconductor while being rotated. In this type of apparatus a single crystal seed crystal of the semiconductor is immersed in the semiconductor melt inside the crucible, and the seed crystal is then gradually pulled upwards, growing a large diameter single crystal of the semiconductor which has the same orientation as the seed crystal.

In recent years there has been considerable development of the continuous charge magnetic field application CZ technique (hereafter abbreviated as the CMCZ technique), which is a variety of the CZ technique where the pulling operation is conducted during continuous supply of the source material to the crucible. In the CMCZ technique a double crucible comprising an outer crucible and an inner crucible comprised of a cylindrical partitioning body is employed, and a single crystal of the semiconductor is pulled from the inner crucible while source material is added to the outer crucible through a source material supply tube made of quartz, and moreover, convection currents within the semiconductor melt inside the inner crucible are suppressed by applying an external magnetic field to the semiconductor melt. The quartz source material supply tube is suspended from the upper portion of the chamber and the lower end opening of the tube is proximate to the surface of the semiconductor melt inside the outer crucible.

The lower end opening of the source material supply tube sits several centimeters above the surface of the semiconductor melt, while the source material is stored in the top portion of the chamber to avoid exposure to radiated heat from the heater and the semiconductor melt. Furthermore, the source material injected into the source material supply tube, flows down the inside of the source material supply tube towards the inside of the chamber, along with the inert gas such as argon which is being used, and enters the semiconductor melt from the aforementioned lower end opening of the tube.

However, in current single crystal pulling apparatuses which employ CMCZ single crystal pulling techniques or vapor techniques, there is a tendency, depending on operating conditions, for the frequency of the occurrence of voids (a lattice defect) in the crystal lattice of the pulled single crystal to be larger than that observed with normal CZ techniques and apparatus.

It is considered that an increase in the frequency of the occurrence of voids in single crystals grown by the CMCZ technique is related to the technique employed for adding source material from the source material supply tube. That is, because the source material is added together with the inert gas flowing through the source material supply tube into a chamber which is maintained at a predetermined pressure, it can be estimated that there is a relationship between the flow rate of the inert gas and the pressure in the furnace, and the occurrence of voids.

The present invention takes the above situation into consideration, with the object of providing a single crystal pulling method which enables a reduction in the occurrence of voids, and an apparatus in which the method is employed.

SUMMARY OF THE INVENTION

The single crystal pulling method of the present invention employs; a gas tight container, a double crucible for storing a semiconductor melt inside the gas tight container comprising an inter-connected outer crucible and inner crucible, and a source material supply tube suspended from an upper portion of the gas tight container and positioned so that a granulated or powdered source material can be added from a lower end opening thereof to the semiconductor melt inside the outer crucible, with the source material being injected into the source material supply tube together with an inert gas flowing towards the enclosed container, and is characterized in that the source material is injected under conditions where the flow rate N (1/min·cm$^2$) of the inert gas is within the range $0.0048P+0.0264<N<0.07P$, where P (Torr) is the internal pressure inside the gas tight container.

Another single crystal pulling method of the present invention employs; a gas tight container, a double crucible for storing a semiconductor melt inside the gas tight container comprising an inter-connected outer crucible and inner crucible, and a source material supply tube suspended from an upper portion of the gas tight container and positioned so that a granulated or powdered source material can be added from a lower end opening thereof to a region of the semiconductor melt between the inner crucible and the outer crucible, and is characterized in that under conditions where the temperature Tm of the supplied portion of the source material is within the range $Ts+50<Tm<Ts+100$, where Ts is the solid-liquid interface temperature, then a weight W (kg) of the semiconductor melt stored in a region between the outer crucible and the inner crucible is within the range $W \geq 0.3\,K-5$ (where $K \geq 20$), where K (g/min) is the amount of source material supplied from the source material supply tube.

BRIEF DESCRIPTION OF THE DRAWINGS

FIG. 3 is a graph showing the results of a melt test and a void occurrence test, with the horizontal axis representing the weight of a semiconductor melt stored in the region between an outer crucible and an inner crucible W (kg), and the vertical axis representing the volume of source material supplied from a source material supply tube K (g/min).

DESCRIPTION OF THE PREFERRED EMBODIMENTS

Below is a description of the single crystal pulling apparatus used with the single crystal pulling method of the present invention, with reference to the diagrams.

Figure 1:
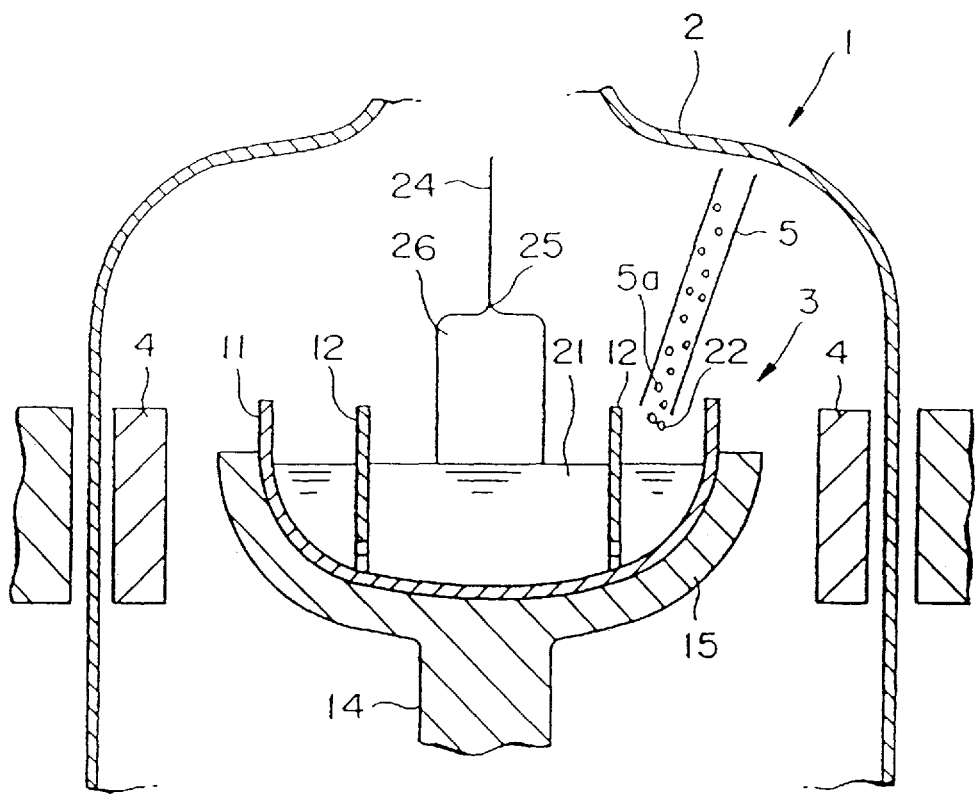
FIG. 1 is a cross-sectional diagram showing a single crystal pulling apparatus employed in one embodiment of the present invention.

As shown in FIG. 1, a double crucible 3, a heater 4 and a source material supply tube 5 are fitted inside a chamber 2 of a single crystal pulling apparatus 1. The double crucible 3 comprises an approximately hemispherical outer crucible 11 made from quartz, and an inner crucible 12 made from quartz, which is a cylindrical partition body fitted inside the outer crucible 11. Connecting apertures (not shown in the figure) for connecting the inner crucible 12 and the outer crucible 11, are formed in the lower portion of the wall of the inner crucible 12.

The double crucible 3 is mounted on a susceptor 15, which sits on a vertical shaft 14 located centrally at the lower portion of the chamber 2, and can be rotated in a horizontal plane, at a specified velocity, about the axis of the shaft 14. Furthermore, a semiconductor melt (the source material for the generation of single crystals of a semiconductor, melted by heating) 21 is stored inside the double crucible 3. The heater 4 heats and melts the semiconductor source material inside the outer crucible 11, and also maintains the temperature of the thus produced semiconductor melt 21. The heater 4 is positioned so as to surround the susceptor 15 and the double crucible 3, and the outside of the heater 4 is surrounded by a heat shield (not shown in the figure) for heat retention purposes.

The source material supply tube 5 is used to continuously supply the granulated or powdered source material of the semiconductor melt 21 onto the surface of the semiconductor melt 21 in the outer crucible 11. Examples of the source materials which can be supplied through the source material supply tube 5 include polysilicon which has been converted to flake form by crushing in a crusher, or polysilicon granules deposited from gaseous source material using thermal decomposition, with further addition, as necessary, of elemental additives known as dopants, such as boron (B) and phosphorus (P). In the case of gallium arsenide, either zinc (Zn) or silicon (Si) are added as the elemental additive.

The source material supply tube 5 is supported at the upper end, and the lower end opening 5a thereof is positioned at a predetermined distance above the surface of the semiconductor melt 21. In order to prevent contamination, and also for workability reasons, the source material supply tube 5 is constructed of a quartz tube with a rectangular cross-section.

A flow of an inert gas such as argon is passed through the source material supply tube 5 towards the inside of the chamber at a predetermined flow rate, and the source material which is injected into the source material supply tube 5 is carried down towards the surface of the semiconductor melt 21 with the inert gas, and released onto the melt surface. The flow rate of the inert gas can be continuously altered depending on the operating conditions.

A pulling mechanism and an inlet aperture for introducing an inert gas such as argon into the chamber 2, are positioned in the upper portion of the chamber 2. A pulling wire 24, which forms part of the pulling mechanism, is configured so as to be movable up and down above the double crucible 3 with continuous rotation. A single crystal seed crystal of the semiconductor is attached to the tip of the pulling wire 24 via a chuck. The seed crystal is immersed in the semiconductor melt 21 inside the inner crucible 12, and then raised up, and a sequentially grown single crystal of the semiconductor is pulled up in an atmosphere of the inert gas such as argon with the seed crystal as the starting point.

At this stage, if the pressure inside the chamber (the pressure in the furnace) is low and the flow rate of the inert gas such as argon is large, the source material will be injected into the semiconductor melt 21 with considerable force, causing vibrations on the surface of the semiconductor melt 21. Furthermore when a single crystal is pulled under these types of conditions, voids (lattice defects) often occur in the single crystal, perhaps due to the fact that the source material penetrates deep down into the semiconductor melt. Moreover, if the pressure in the furnace is high and the flow rate of the inert gas such as argon is low, the progress of the source material is retarded inside the source material supply tube 5, and addition of the source material becomes impossible. Furthermore, if the pressure in the furnace is high, the elimination of residual gas from within the semiconductor melt is suppressed and the occurrence rate of voids increases.

The following experiments were conducted with due consideration being given to the types of relationships described above between the pressure inside the chamber and the flow rate of the inert gas, and the occurrence of voids.

Source material retardation tests, melt surface vibration tests and void occurrence tests were conducted for various gas flow rates and furnace pressures with argon as the inert gas, and the distance between the lower end opening 5a of the source material supply tube 5 and the surface of the semiconductor melt 21 set at 30 mm. The results are shown in tables 1 and 2.

TABLE 1

| No. | GAS FLOW RATE (L/min) | CROSS SECTION AREA OF SUPPLY PORTION ($cm^2$) | FLOW RATE PER UNIT AREA ($L/min \cdot cm^2$) | PRESSURE IN THE FURNACE (Torr) | RESULTS OBSERVED x NOT OBSSERVED o | | |
|---|---|---|---|---|---|---|---|
| | | | | | RETARDATION | SURFACE VIBRATION | VOID |
| 1 | 0.25 | 4.41 (2.1 × 2.1) | 0.057 | 7 | x | — | — |
| 2 | | | | 10 | x | — | — |
| 3 | | | | 15 | x | — | — |
| 4 | | | | 30 | x | — | — |
| 5 | | 3.15 (1.5 × 2.1) | 0.079 | 7 | x | — | — |
| 6 | | | | 10 | x | — | — |
| 7 | | | | 15 | x | — | — |
| 8 | | | | 30 | x | — | — |
| 9 | | 2.25 (1.5 × 1.5) | 0.111 | 7 | o | — | — |
| 10 | | | | 10 | o | — | — |
| 11 | | | | 15 | o | — | — |
| 12 | | | | 30 | x | — | — |
| 13 | 0.5 | 4.41 (2.1 × 2.1) | 0.113 | 7 | o | — | — |

TABLE 1-continued

| No. | GAS FLOW RATE (L/min) | CROSS SECTION AREA OF SUPPLY PORTION (cm$^2$) | FLOW RATE PER UNIT AREA (L/min · cm$^2$) | PRESSURE IN THE FURNACE (Torr) | RETARDATION | SURFACE VIBRATION | VOID |
|---|---|---|---|---|---|---|---|
| 14 | | | | 10 | ○ | — | — |
| 15 | | | | 15 | ○ | — | — |
| 16 | | | | 30 | x | — | — |
| 17 | | 3.15 (1.5 × 2.1) | 0.159 | 7 | ○ | — | — |
| 18 | | | | 10 | ○ | — | — |
| 19 | | | | 15 | ○ | — | — |
| 20 | | | | 30 | x | — | — |
| 21 | | 2.25 (1.5 × 1.5) | 0.222 | 7 | ○ | — | — |
| 22 | | | | 10 | ○ | — | — |
| 23 | | | | 15 | ○ | — | — |
| 24 | | | | 30 | ○ | — | — |
| 25 | 0.75 | 4.41 (2.1 × 2.1) | 0.17 | 7 | ○ | — | ○ |
| 26 | | | | 10 | ○ | — | ○ |
| 27 | | | | 15 | ○ | — | ○ |
| 28 | | | | 30 | x | — | — |
| 29 | | 3.15 (1.5 × 2.1) | 0.238 | 7 | — | — | — |
| 30 | | | | 10 | — | — | — |
| 31 | | | | 15 | — | — | — |
| 32 | | | | 30 | ○ | — | — |
| 33 | | 2.25 (1.5 × 1.5) | 0.333 | 7 | — | — | — |
| 34 | | | | 10 | — | — | — |
| 35 | | | | 15 | — | — | — |
| 36 | | | | 30 | — | — | — |

TABLE 2

| No. | GAS FLOW RATE (L/min) | CROSS SECTION AREA OF SUPPLY PORTION (cm$^2$) | FLOW RATE PER UNIT AREA (L/min · cm$^2$) | PRESSURE IN THE FURNACE (Torr) | RETARDATION | SURFACE VIBRATION | VOID |
|---|---|---|---|---|---|---|---|
| 37 | 1.5 | 4.41 (2.1 × 2.1) | 0.34 | 7 | ○ | ○ | ○ |
| 38 | | | | 10 | ○ | ○ | ○ |
| 39 | | | | 15 | ○ | — | ○ |
| 40 | | | | 30 | — | — | — |
| 41 | | 3.15 (1.5 × 2.1) | 0.476 | 7 | — | — | x |
| 42 | | | | 10 | — | — | ○ |
| 43 | | | | 15 | — | — | ○ |
| 44 | | | | 30 | — | — | — |
| 45 | | 2.25 (1.5 × 1.5) | 0.667 | 7 | — | — | — |
| 46 | | | | 10 | — | — | — |
| 47 | | | | 15 | — | — | — |
| 48 | | | | 30 | — | — | — |
| 49 | 3 | 4.41 (2.1 × 2.1) | 0.68 | 7 | — | x | — |
| 50 | | | | 10 | — | ○ | x |
| 51 | | | | 15 | — | ○ | ○ |
| 52 | | | | 30 | — | ○ | — |
| 53 | | 3.15 (1.5 × 2.1) | 0.952 | 7 | — | — | — |
| 54 | | | | 10 | — | — | — |
| 55 | | | | 15 | — | — | — |
| 56 | | | | 30 | — | — | — |
| 57 | | 2.25 (1.5 × 1.5) | 1.333 | 7 | — | — | — |
| 58 | | | | 10 | — | — | — |
| 59 | | | | 15 | — | x | — |
| 60 | | | | 30 | — | ○ | — |

Figure 2:
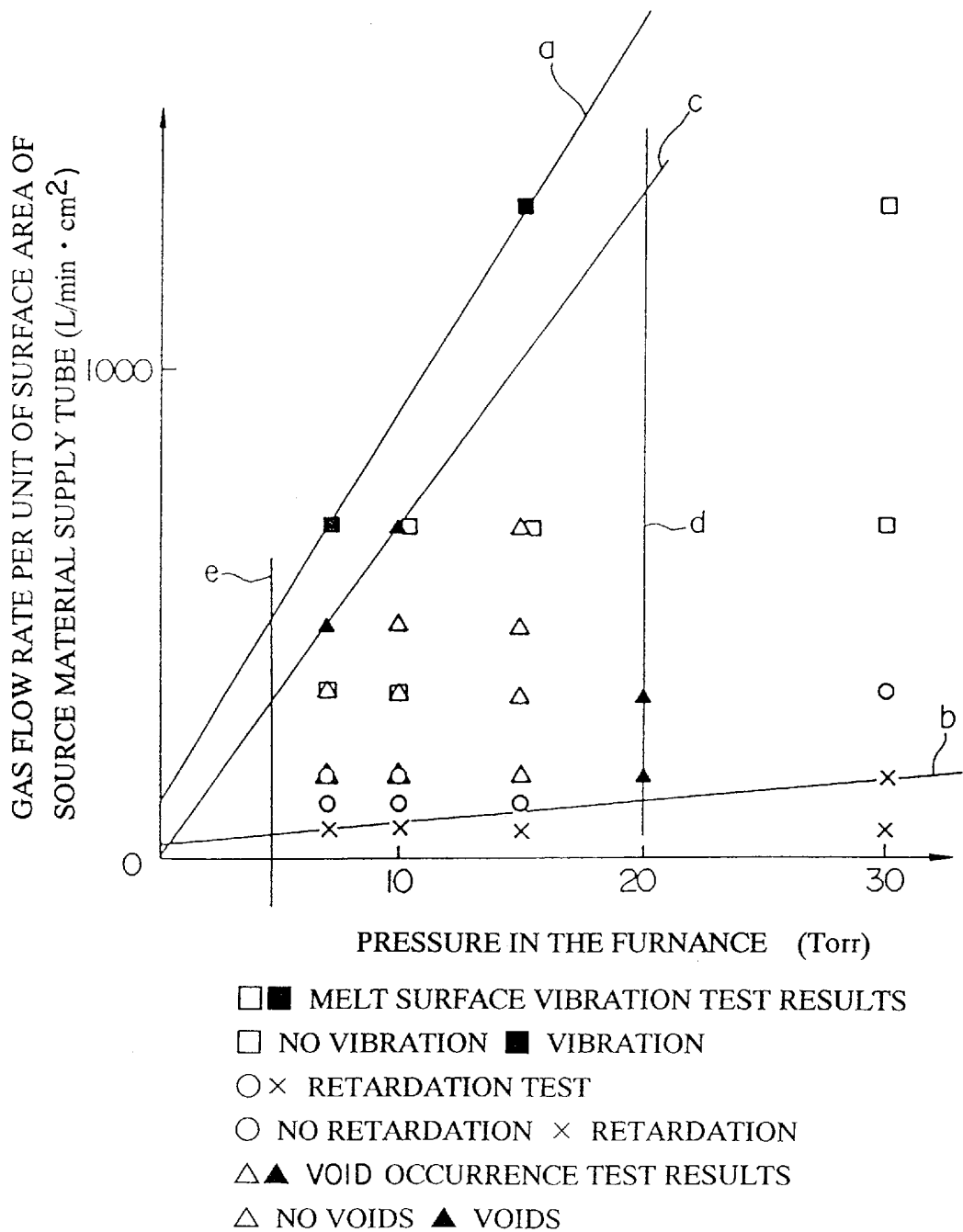
FIG. 2 is a graph showing the results of a source material retardation test, a melt surface vibration test and a void occurrence test, with the horizontal axis representing the pressure in the furnace P (Torr), and the vertical axis representing the gas flow rate N (1/min·cm$^2$) per unit of surface area across a source material supply tube.

The results of the various tests arranged in graph form, with the pressure in the furnace P (Torr) shown along the horizontal axis and the gas flow rate per unit of surface area across the source material supply tube N (1/min·cm$^2$) shown along the vertical axis, are presented in FIG. 2. Some of the data shown in tables 1 and 2 is omitted in FIG. 2.

The line (a) in the figure is the line which divides the region where vibration of the melt surface occurs from the region where no such vibration occurs, and statistical analysis of the data reveals the equation of the line to be N=0.08P+0.12. Consequently, for values of N<0.08P+0.12 vibration of the melt surface does not occur. This result suggests that the source material injection velocity is suppressed by the pressure in the furnace.

The line (b) in the figure is the line which divides the region where retardation of the source material occurs from the region where no such retardation occurs, and statistical analysis of the data reveals the equation of the line to be N=0.0048P+0.0264. Consequently, for values of N>0.0048P+0.0264 retardation of the source material does not occur.

The line (c) is the line which divides the region where voids occur from the region where voids do not occur, for those instances where the pressure in the furnace is held constant and the gas flow rate is increased, and statistical analysis of the data reveals the equation of the line to be N=0.07P. Consequently, for values of N<0.07P voids do not occur. It is assumed that when the source material is injected into the semiconductor melt with a high velocity it will penetrate deeply into the semiconductor melt and some of the atmospheric gas will be incorporated into the semiconductor melt along with the source material, and that this atmospheric gas is the cause of the occurrence of voids. Consequently, it is thought that in the region below the line (c) the velocity of the source material is reduced by the furnace pressure thus preventing the occurrence of voids.

Furthermore, if the pressure in the furnace is increased the elimination of residual gas from within the semiconductor melt is suppressed and the occurrence rate of voids increases. From the experimental results the line (d) can be obtained which divides the region where voids occur from the region where voids do not occur. The equation for line (d) is N=20.

From the above results it is clear that within the region bounded by the lines (a), (b), (c) and (d) stable single crystal growth using the CMCZ technique can be achieved.

Moreover, below furnace pressure values of P=5 (Torr) represented by line (e) in the figure the semiconductor melt 21 will boil, and so for practical purposes, it is necessary to maintain conditions within the region bounded by the lines (a), (b), (c), (d) and (e).

Furthermore, the lines (a), (c) and (d) will shift depending on the distance between the lower end opening 5a of the source material supply tube 5 and the surface of the semiconductor melt 21. Consequently, the lines will shift as shown by the-equations, line (a), $N=(0.076\sim0.084)P+(0.10\sim0.14)$ line (b), $N=(0.066\sim0.074)P+(-0.02\sim0.02)$ line (d), $N=18\sim22$.

Furthermore, the line (e) will shift depending on thermal environment factors such as the radial temperature gradient of the melt surface. Consequently, the line (e) will shift within the range $P=(3\sim7)$.

As explained above, the single crystal pulling method of the first embodiment of the present invention employs; a gas tight container, a double crucible for storing a semiconductor melt inside the gas tight container comprising an inter-connected outer crucible and inner crucible, and a source material supply tube suspended from the upper portion of the gas tight container and positioned so that a granulated or powdered source material can be added from a lower end opening thereof to the semiconductor melt inside the outer crucible, with the source material being injected into the source material supply tube together with an inert gas flowing towards the enclosed container, and since the source material is injected under conditions where the flow rate N (1/min·cm$^2$) of the inert gas is within the range 0.0048P+0.0264<N<0.07P, where P (Torr) is the internal pressure inside the gas tight container, then the single crystal growing process can be conducted with a reduction in the occurrence of voids.

In addition, the following experiments were conducted with due consideration being given to the relationship between the weight of the semiconductor melt (the source material injection region weight) and the rate of the source material supplied through the source material supply tube, and the occurrence of voids.

Melt capacity tests and void occurrence tests were conducted while the weight of the semiconductor melt stored in the region between the outer and inner crucibles (the source material injection region weight) and the rate of the source material supplied through the source material supply tube were altered. The experiments were conducted under conditions where the temperature of the supplied portion of the source material Tm(°C.) was within the range Ts+50<Tm<Ts+100, where Ts(°C.) is the solid-liquid interface temperature.

The results of the investigations are shown in the graph in FIG. 3, with the weight of the semiconductor melt stored in the region between the outer crucible and the inner crucible (the source material injection region weight) W(kg) shown along the vertical axis, and the source material supply rate from the source material supply tube K(g/min) shown along the horizontal axis. In the FIG. 3-the small circles (○) indicate those instances where the added source material melted without any recrystallization, and the small crosses (x) indicate those instances where the source material recrystallized and did not melt. Furthermore, the large crosses (X) indicate those instances where voids occurred, and the large circles (◯) indicate those instances where voids did not occur.

These results yield the line (a) which divides those instances where the melt capacity was insufficient from those instances where the melt capacity was sufficient. Furthermore, the line (b) is also obtained, which divides the region where voids occur from the region where voids do not occur for those instances where melting is feasible. Statistical analysis reveals that line (b) is represented by the equation W=0.3K−5 (where K≧20). Consequently, for values of K≧20 and with W≧0.3K−5, single crystal growth can be carried out with suppression of the occurrence of voids.

For those instances outside the conditions described above, that is in the region where W<0.3K−5, either the source material injection region weight W can be increased or the source material supply rate reduced so as to satisfy the above condition that W ≧0.3K−5. Increasing the depth of the semiconductor melt enables the value of W to be increased to some extent, but of course this is limited by the size of the double crucible 3, and so a design change and use of a larger diameter crucible is preferable. Moreover, the pulling velocity needs to be reduced in order to allow a reduction in the source material supply rate.

As explained above, the single crystal pulling method of the second embodiment of the present invention employs; a gas tight container, a double crucible for storing a semiconductor melt inside the gas tight container comprising an inter-connected outer crucible and inner crucible, and a source material supply tube suspended from an upper portion of the gas tight container and positioned so that a granulated or powdered source material can be added from a lower end opening thereof to a region of the semiconductor melt between the inner crucible and the outer crucible, and since under conditions where the temperature Tm (°C.) of the supplied portion of the source material is within the range Ts+50<Tm<Ts+100, where Ts (°C.) is the solid-liquid interface temperature, a weight W (kg) of the semiconductor melt stored in a region between the outer crucible and the inner crucible is within the range $W \geq 0.3K-5$ (where $K \geq 20$), where K (g/min) is the source material supply rate supplied from the source material supply tube, then single crystal growth can be carried out with reduction in the occurrence of voids.

What is claimed is:

1. A single crystal pulling method employing; a gas tight container, a double crucible for storing a semiconductor melt inside the gas tight container comprising an inter-connected outer crucible and inner crucible, and a source material supply tube suspended from an upper portion of the gas tight container and positioned so that a granulated or powdered source material can be added from a lower end opening thereof to the semiconductor melt inside the outer crucible, with the source material being injected into the source material supply tube together with an inert gas flowing towards the enclosed container, characterized in that said source material is injected under conditions where the flow rate N (1/min·cm$^2$) of the inert gas is within the range 0.0048P+0.0264<N<0.07P, where P (Torr) is the internal pressure inside said gas tight container.

2. The method of claim 1, wherein the inert gas comprises argon.

3. The method of claim 1, wherein the source material comprises polysilicon.

4. The method of claim 3, wherein the source material further comprises elemental additives selected from the group comprising boron and phosphorus.

5. The method of claim 1, wherein the source material comprises gallium arsenide.

6. The method of claim 5, wherein the source material further comprises elemental additives selected from the group including zinc and silicon.

7. A single crystal pulling method employing; a gas tight container, a double crucible for storing a semiconductor melt inside the gas tight container comprising an inter-connected outer crucible and inner crucible, and a source material supply tube suspended from an upper portion of the gas tight container and positioned so that a granulated or powdered source material can be added from a lower end opening thereof to a region of the semiconductor melt between the inner crucible and the outer crucible, characterized in that under conditions where the temperature Tm (°C.) of the supplied portion of the source material is within the range Ts+50<Tm<Ts+100, where Ts (°C.) is the solid-liquid interface temperature, a weight W (kg) of the semiconductor melt stored in a region between the outer crucible and the inner crucible is within the range $W \geq 0.3K-5$ (where $K \geq 20$), where K (g/min) is the amount of source material supplied from the source material supply tube.

8. An apparatus for implementing the single crystal pulling method according to one claim of claim 1 and claim 7.

9. The method of claim 7, wherein the source material comprises polysilicon.

10. The method of claim 9, wherein the source material further comprises elemental additives selected from the group comprising boron and phosphorus.

11. The method of claim 7, wherein the source material comprises gallium arsenide.

12. The method of claim 11, wherein the source material further comprises elemental additives selected from the group including zinc and silicon.

* * * * *